(12) United States Patent
Huang et al.

(10) Patent No.: US 9,548,371 B2
(45) Date of Patent: Jan. 17, 2017

(54) INTEGRATED CIRCUITS HAVING NICKEL SILICIDE CONTACTS AND METHODS FOR FABRICATING THE SAME

(71) Applicant: GLOBALFOUNDRIES Singapore Pte. Ltd., Singapore (SG)

(72) Inventors: Jingyan Huang, Singapore (SG); Chuan Wang, Singapore (SG); Chim Seng Seet, Singapore (SG); Yun Ling Tan, Singapore (SG); Alex See, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 14/259,460

(22) Filed: Apr. 23, 2014

(65) Prior Publication Data

US 2015/0311221 A1 Oct. 29, 2015

(51) Int. Cl.

| H01L 21/336 | (2006.01) |
|---|---|
| H01L 29/49 | (2006.01) |
| H01L 21/28 | (2006.01) |
| H01L 29/423 | (2006.01) |
| H01L 29/66 | (2006.01) |
| H01L 27/115 | (2006.01) |
| H01L 21/285 | (2006.01) |
| H01L 21/768 | (2006.01) |
| H01L 29/45 | (2006.01) |

(52) U.S. Cl.
CPC ......... *H01L 29/49* (2013.01); *H01L 21/28273* (2013.01); *H01L 21/28518* (2013.01); *H01L 21/76843* (2013.01); *H01L 21/76855* (2013.01); *H01L 27/11521* (2013.01); *H01L 29/42328* (2013.01); *H01L 29/665* (2013.01); *H01L 29/66825* (2013.01); *H01L 29/456* (2013.01)

(58) Field of Classification Search
CPC .... H01L 29/7883; H01L 21/283; H01L 29/49; H01L 21/336; H01L 29/788
USPC ........................................................ 257/312
See application file for complete search history.

(56) References Cited

U.S. PATENT DOCUMENTS

| 9,080,651 | B2* | 7/2015 | Schwarzbach | .......... B29C 45/76 |
|---|---|---|---|---|
| 9,082,651 | B2* | 7/2015 | Wu | |
| 2009/0098674 | A1* | 4/2009 | Yamazaki | ......... H01L 21/76254 438/30 |
| 2012/0012918 | A1* | 1/2012 | Zhu | ................... H01L 21/28273 257/316 |
| 2014/0138675 | A1* | 5/2014 | Yamazaki | ......... H01L 29/66757 257/43 |

* cited by examiner

*Primary Examiner* — Tuan Nguyen
(74) *Attorney, Agent, or Firm* — Lorenz & Kopf, LLP

(57) ABSTRACT

Integrated circuits having nickel silicide contacts and methods for fabricating integrated circuits with nickel silicide contacts are provided. An exemplary method for fabricating an integrated circuit includes providing a semiconductor substrate and forming a nonvolatile memory structure over the semiconductor substrate. The nonvolatile memory structure includes a gate surface. The method further includes depositing a nickel-containing material over the gate surface. Also, the method includes annealing the nonvolatile memory structure and forming a nickel silicide contact on the gate surface from the nickel-containing material.

20 Claims, 3 Drawing Sheets

INTEGRATED CIRCUITS HAVING NICKEL SILICIDE CONTACTS AND METHODS FOR FABRICATING THE SAME

TECHNICAL FIELD

The present disclosure generally relates to integrated circuits having nickel silicide contacts and methods for fabricating integrated circuits having nickel silicide contacts, and more particularly relates to integrated circuits and methods for fabricating integrated circuits having nickel silicide contacts to nonvolatile memory structures.

BACKGROUND

Integrated circuits find application in many of today's consumer electronics, such as cell phones, video cameras, portable music players, printers, computers, calculators, automobiles, etc. Integrated circuits may include a combination of active devices, passive devices and their interconnections.

In some instances, integrated circuits may take the form of nonvolatile memory designed to store digital data in the form of an electrical charge. Uniquely, a nonvolatile memory charge remains in storage even after the power is turned off. Accordingly, the use of nonvolatile memory devices can be particularly advantageous for power saving applications or in applications where power can be interrupted.

Nonvolatile memory usually takes one of two forms, a stack-gate form or a split-gate form. Nonvolatile memory cells utilizing the stack-gate type structure typically employ a configuration where a control gate lies over a floating gate in a stack. A select gate may be positioned adjacent the stack. In conventional programming schemes, contacts are formed to the control gate and select gate, as well as to source/drain regions adjacent the stack gate structure.

As the current processing technology node continues to decrease, contact area on nonvolatile memory devices necessarily shrinks. With reduced contact area, contact resistance increases. Thus, there is a need to provide reliable contacts to nonvolatile memory devices with low contact resistance, such as with a resistivity of less than about 30 microhm centimeter ($\mu\Omega \cdot cm$). Such contacts may provide for integrated circuit exhibiting improved programming speed, while increasing the amount of information that can be stored in a defined area. Further, there is a need to provide methods for forming such contacts that do not damage or inhibit performance of logic and other memory device components, such as through the use of low temperature anneal processes.

Accordingly, it is desirable to provide integrated circuits having nickel silicide contacts. Further, it is desirable to provide integrated circuits having nonvolatile memory structures with improved contacts. Also, it is desirable to provide methods for fabricating integrated circuits with contacts formed with low temperature anneal processes. Furthermore, other desirable features and characteristics will become apparent from the subsequent detailed description and the appended claims, taken in conjunction with the accompanying drawings and the foregoing technical field and background.

BRIEF SUMMARY

Integrated circuits having nickel silicide contacts and methods for fabricating integrated circuits with nickel silicide contacts are provided. In an exemplary embodiment, a method for fabricating an integrated circuit includes providing a semiconductor substrate and forming a nonvolatile memory structure over the semiconductor substrate. The nonvolatile memory structure includes a gate surface. The method further includes depositing a nickel-containing material over the gate surface. Also, the method includes annealing the nonvolatile memory structure and forming a nickel silicide contact on the gate surface from the nickel-containing material.

In another embodiment, a method for fabricating an integrated circuit includes providing a stack gate memory structure overlying a semiconductor substrate and adjacent source/drain regions formed in the semiconductor substrate. The stack gate memory structure includes a control gate lying over a floating gate in a stack and a select gate formed adjacent the stack. The method includes depositing a nickel-containing material on a surface of the control gate and on a surface of the select gate. Also, the method includes depositing a contact liner over the nickel-containing material. Further, the method includes annealing the stack gate memory structure and forming a silicide contact on the surface of the control gate from the nickel-containing material and a silicide contact on the surface of the select gate from the nickel-containing material.

In accordance with another embodiment, an integrated circuit is provided. The integrated circuit includes a stack gate memory structure overlying a semiconductor substrate and adjacent a source/drain region. The stack gate memory structure includes a control gate lying over a floating gate in a stack and a select gate formed adjacent the stack. The integrated circuit further includes nickel silicide contacts formed on the control gate, the select gate, and the source/drain region.

BRIEF DESCRIPTION OF THE DRAWINGS

Embodiments of the integrated circuits having nickel silicide contacts, and methods for fabricating integrated circuits having nickel silicide contacts will hereinafter be described in conjunction with the following drawing figures, wherein like numerals denote like elements, and wherein.

DETAILED DESCRIPTION

Figure 1:
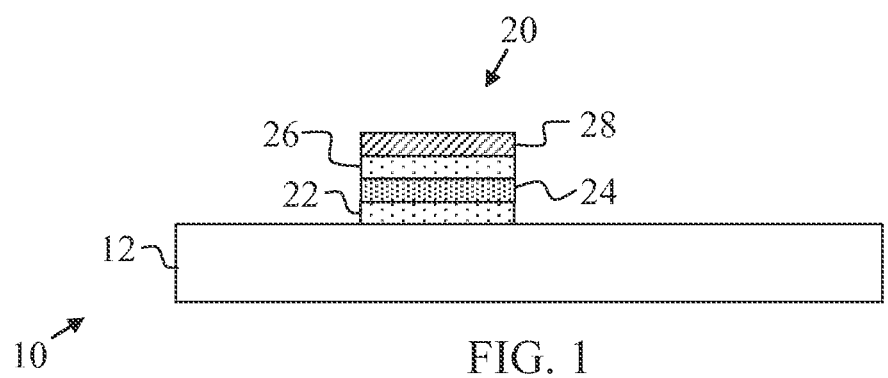
FIGS. 1-7 illustrate, in cross section, a portion of an integrated circuit and method steps for fabricating the integrated circuit in accordance with various embodiments herein.

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having nickel silicide contacts and methods for fabricating integrated circuits having nickel silicide contacts are provided. Generally, the following embodiments relate to the formation of an integrated circuit including, but not limited to, a nonvolatile memory device. An exemplary nonvolatile memory device has a stack gate memory structure with a stack including a control gate located over a floating gate, and with a select gate adjacent the stack. The exemplary nonvolatile memory device further includes source/drain regions adjacent the stack and the select gate. In an exemplary embodiment, the methods for fabricating integrated circuits include depositing nickel-containing material on surfaces of the control gate, select gate, and source/drain regions and annealing the structure to cause formation of nickel silicide contacts from the nickel-containing material. Exemplary embodiments utilize low temperatures anneal processes at temperatures of no more than about 550° C., such as no more than about 500° C., for example no more than about 400° C. It has been determined that higher temperature anneals may form contacts having higher resistivity. As a result, the methods described herein provide for formation of low resistance contacts.

FIGS. 1-7 illustrate sequentially a method for fabricating an integrated circuit having nickel silicide contacts in accordance with various embodiments herein. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Turning now to FIG. 1, in an exemplary embodiment, the process of fabricating an integrated circuit 10 begins by providing a semiconductor substrate 12. The semiconductor substrate 12 for example is a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Further, the semiconductor substrate 12 may optionally include an epitaxial layer (epi layer). Also, the semiconductor substrate 12 may be doped as desired.

In FIG. 1, a stack 20 is formed for use in an integrated circuit 10 as a portion of a nonvolatile memory device. The stack 20 is formed from a plurality of layers that are deposited and etched. Specifically, in the exemplary embodiment a dielectric layer 22, such as a tunnel dielectric layer, is deposited overlying the semiconductor substrate 12. "As used herein "overlying" means "on" and "over". In this regard, the dielectric layer 22 may lie directly on the semiconductor substrate 12 such that it makes physical contact with the semiconductor substrate 12 or it may lie over the semiconductor substrate 12 such that another material layer, for example, another dielectric layer, is interposed between the semiconductor substrate 12 and dielectric layer 22. An exemplary dielectric layer 22 may include silicon oxide, silicon oxynitride, a silicon oxide/nitride/oxide stack, a high-k dielectric material (i.e., a material having a dielectric constant value greater than silicon oxide), or a combination thereof. The dielectric layer 22 can be formed by thermal oxidation, atomic layer deposition (ALD), chemical vapor deposition (CVD), physical vapor deposition (PVD), or by other suitable methods. The dielectric layer 22 may also include a multilayer structure and/or different materials for n-channel field effect transistor (NFET) and p-channel field effect transistor (PFET) devices. In at least one embodiment, the dielectric layer 22 may include a multi-layer structure, such as a first layer of an oxide and a second layer of a high-k dielectric material.

In the exemplary embodiment of FIG. 1, a charge trapping layer 24 is deposited over the dielectric layer 22. An exemplary charge trapping layer 24 is formed of a material capable of storing a charge. Examples of suitable materials capable of storing a charge include, but are not limited to, silicon, silicon germanium, a nitride, and metal-containing material. In an exemplary embodiment, the charge storage material includes discontinuous silicon nanocrystals or metal nanoclusters. It is to be understood that the terms nanocrystals and nanoclusters as used herein include charge storage materials that are not necessarily crystalline in structure. Generally, the charge trapping layer 24 may include nanocrystals and nanoclusters that range in maximum dimension or diameter between about 10 angstroms to about 150 angstroms, although it is understood that nanocrystals or nanoclusters having larger or smaller maximum dimensions or diameters can be used. However, it is to be understood that the nanocrystals and nanoclusters in the charge trapping layer 24 are not to be so large as to form a continuous structure (i.e., the nanocrystals and nanoclusters are to be discrete discontinuous elements). Additionally, it is to be understood that the shapes of the nanocrystals or nanoclusters within the charge trapping layer 24 need not necessarily be spherical and may include other non-spherical shapes as well. Moreover, it will be appreciated by those skilled in the art that the size and density of the charge trapping layer 24 can be strategically optimized to obtain desired write, erase, and programming speed characteristics The methods and techniques used to form the charge trapping layer 24 are well known within the art and not repeated herein.

In the exemplary embodiment, a dielectric layer 26, such as an intergate dielectric layer, is deposited over the charge trapping layer 24. The dielectric layer 26 can be made from materials including, but not limited to, silicon oxide, silicon nitride, silicon oxynitride, a high-k dielectric material (i.e., one having a dielectric constant value greater than silicon oxide), or a combination thereof, and may be any suitable material that permits induction and storage of a charge when an appropriate voltage is applied. An exemplary dielectric layer 26 may be thermally grown using an oxidizing or nitridizing ambient or deposited using a conventional chemical vapor deposition technique, physical vapor deposition technique, atomic layer deposition technique, or a combination thereof. The dielectric layer 26 can have the same or different composition compared to the dielectric layer 22 and may be formed using the same or different formation technique compared to the dielectric layer 22. Generally, the dielectric layers 22 and 26 can each have a thickness in a range of approximately 1 nanometer (nm) to approximately 10 nm, although it is to be understood that larger or smaller thickness may be used as well. Moreover, the thickness and the material selection of each of the dielectric layers 22 and 26 are selected based on the layers' desired electrical properties, e.g., desired write, erase, and programming speed characteristics.

The exemplary embodiment of the method continues with the deposition of a control gate material 28 overlying the dielectric layer 26. The control gate material 28 can be non-selectively formed over or on the integrated circuit 10, or more specifically over the dielectric layer 26. In an exemplary embodiment, the control gate material 28 is polysilicon, though it can be made from any conventional gate electrode-forming material including doped and undoped semiconductor materials (such as, for example, polysilicon, amorphous silicon, or silicon germanium), a metal, a metallic alloy, a silicide, a metal nitride, a metal oxide, a carbon nanotube, or a combination thereof. If the control gate material 28 includes a metal, the metal may include copper, tungsten, aluminum, aluminum alloy, palladium, titanium, tantalum, nickel, cobalt, and molybdenum. Furthermore, if the control gate material 28 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. Other materials that may be known to those skilled in the art for gate structures may also be used for the control gate material 28. Generally, the control gate material 28 can be formed by CVD, PVD, silicidation, plating, and/or ALD. The control gate material 28 may also include a multilayer structure and/or a dual structure. For use with silicide contacts, the exemplary control gate material 28 includes a silicon-containing material.

In FIG. 1, the layers 22, 24, 26 and 28 are etched using conventional lithography and etching processes to form a stack 20. For example, a mask (not shown) is formed and patterned over layer 28, and regions not covered by the mask are etched, such as by reactive ion etching (RIE). In stack 20, the charge trapping layer forms a floating gate 24 and the control gate material forms a control gate 28. The dielectric layer 22 electrically isolates the floating gate 24 from a channel and source/drain regions in the semiconductor substrate 12. During use, the floating gate 24 stores an electric charge and is electrically isolated from the control gate 28 and the channel and source/drain regions in the semiconductor substrate 12. During use, the control gate 28 generates an electric field to control the size of the channel formed under the stack 20. After forming the stack 20, the mask is removed. Ion implantations may be performed thereafter to dope regions of the semiconductor substrate 12.

Figure 2:
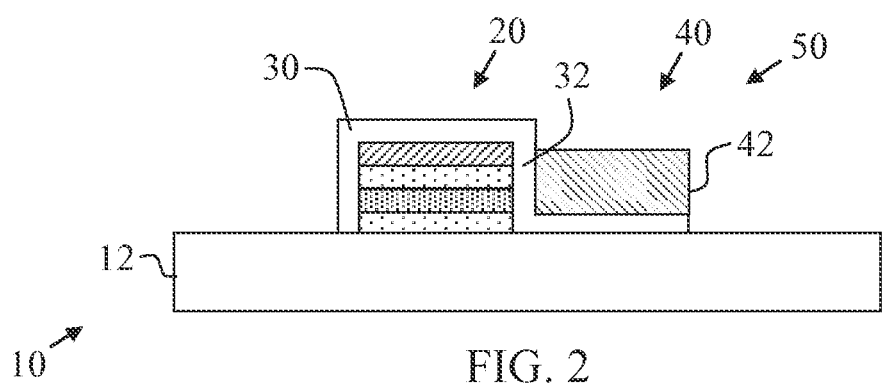

The exemplary method may continue in FIG. 2 with deposition of a dielectric layer 30 over the stack 20 and the semiconductor substrate 12. The dielectric layer 30 can be made from materials including, but not limited to, silicon oxide, silicon nitride, silicon oxynitride, a high-k dielectric material (i.e., one having a dielectric constant value greater than silicon oxide), or a combination thereof, and may be any suitable material that permits induction and storage of a charge when an appropriate voltage is applied. An exemplary dielectric layer 30 may be thermally grown using an oxidizing or nitridizing ambient or deposited using a conventional chemical vapor deposition technique, physical vapor deposition technique, atomic layer deposition technique, or a combination thereof. The dielectric layer 30 can have the same or different composition compared to the dielectric layer 22 or 26 and may be formed using the same or different formation technique compared to the dielectric layer 22 or 26. The dielectric layer 30 can be formed by CVD, ALD, PVD, or by other suitable methods. As shown, the dielectric layer 30 includes a sidewall portion 32 adjacent the stack 20.

After formation of the dielectric layer 30, a select gate 40 is formed. Specifically, a select gate material 42 is deposited over the dielectric layer 30. In an exemplary embodiment, the select gate material 42 is conformally deposited overlying the dielectric layer 30. An exemplary select gate material 42 is polysilicon though it can be any conventional material including doped and undoped semiconductor materials (such as, for example, polysilicon, amorphous silicon, or silicon germanium), a metal, a metallic alloy, a silicide, a metal nitride, a metal oxide, a carbon nanotube, or a combination thereof. If the select gate material 42 includes a metal, the metal may include copper, tungsten, aluminum, aluminum alloy, palladium, titanium, tantalum, nickel, cobalt, and molybdenum. Furthermore, if the select gate material 42 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. Other materials, which may be known to those skilled in the art for gate structures, may also be used for the select gate material 42. Generally, the select gate material 42 can be formed by CVD, PVD, silicidation, plating, and/or ALD. The select gate material 42 may also include a multilayer structure and/or a dual structure. For the purposes of discussion, the exemplary select gate material 42 is a silicon-containing material.

As illustrated in FIG. 2, the select gate material 42 and dielectric layer 30 are etched to form the select gate 40 adjacent the stack 20, with the sidewall portion 32 of the dielectric layer 30 separating, and electrically isolating, the select gate 40 and the stack 20. In an exemplary method, the select gate material 42 is polysilicon and is etched in a two-step process. First, the select gate material 42 is planarized to a common height with other components in logic devices (not shown) on the semiconductor substrate 12. Then, the select gate material 42 is etched during a process etching all polysilicon components on the semiconductor substrate 12, such as by a reactive ion etch or other suitable etch processes. The dielectric layer 30 underlying the select gate 40 may be considered to be a select gate dielectric. The stack 20 and select gate 40 form a nonvolatile memory structure 50. The select gate 40 defines a select gate channel in the underlying semiconductor substrate 12.

Figure 3:
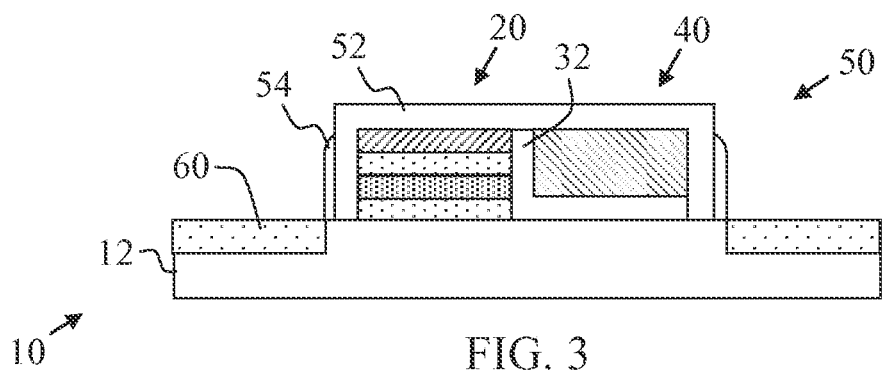

In the exemplary embodiment of FIG. 3, a dielectric layer 52 is deposited over nonvolatile memory device structure 50. Specifically, the dielectric layer 52 covers the stack 20 and select gate 40. The dielectric layer 52 may include silicon oxide, silicon oxynitride, a silicon oxide/nitride/oxide stack, a high-k dielectric material (i.e., a material having a dielectric constant value greater than silicon oxide), or a combination thereof. The dielectric layer 52 can be formed by CVD, ALD, PVD, or by other suitable methods. After deposition, the dielectric layer 52 may be selectively etched from the semiconductor substrate 12. Further, as shown in FIG. 3, spacers 54 may be formed around the nonvolatile memory device structure 50. For example, a spacer-forming material may be conformally deposited over the nonvolatile memory device structure 50 and the semiconductor substrate 12, and then anisotropically etched to form the spacers 54 on the sidewalls adjacent the nonvolatile memory device structure 50 formed by dielectric layer 52.

In an exemplary embodiment, ion implantations are performed using the spacers 54 and nonvolatile memory device structure 50 as a mask to form source/drain regions 60 in the semiconductor substrate 12. The ions used to form the source/drain regions 60 may include n-type or p-type, depending on the type of device being formed. Ion implantations may be performed with differing ion species, implant angles, and energies to provide the desired implant profile in the semiconductor substrate 12.

Figure 4:
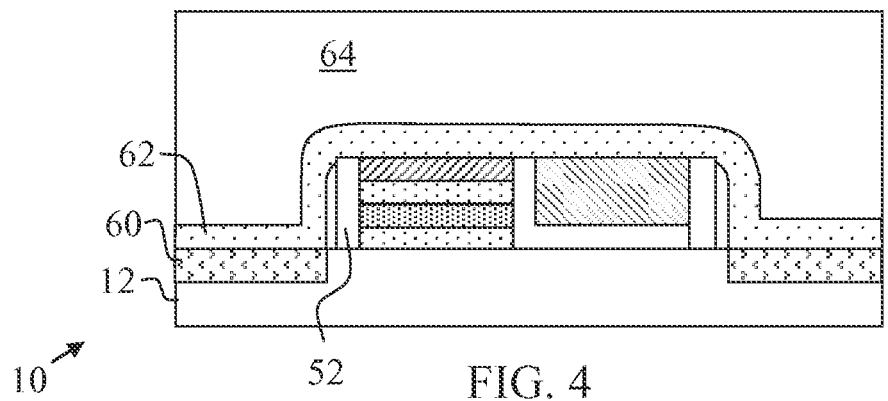

The method may continue with removal of the dielectric layer 52 from the top of the nonvolatile memory device structure 50 in FIG. 4. For example, the dielectric layer 52 may be removed by a chemical-mechanical planarization (CMP) process. Then, a dielectric layer 62 may be conformally deposited over the semiconductor substrate 12 and the nonvolatile memory device structure 50. An exemplary dielectric layer 62 includes silicon oxide, silicon oxynitride, a silicon oxide/nitride/oxide stack, a high-k dielectric material (i.e., a material having a dielectric constant value greater than silicon oxide), or a combination thereof. The dielectric layer 62 can be formed by CVD, ALD, PVD, or by other suitable methods. As shown in FIG. 4, an interlayer dielectric 64 is deposited over the dielectric layer 62. An exemplary interlayer dielectric 64 includes silicon oxide or silicon nitride. While a dielectric layer 62 and interlayer dielectric 64 are illustrated in the exemplary embodiment, a single dielectric may be deposited over the nonvolatile memory device structure 50, or more than two dielectric materials may be deposited over the nonvolatile memory device structure 50.

Figure 5:
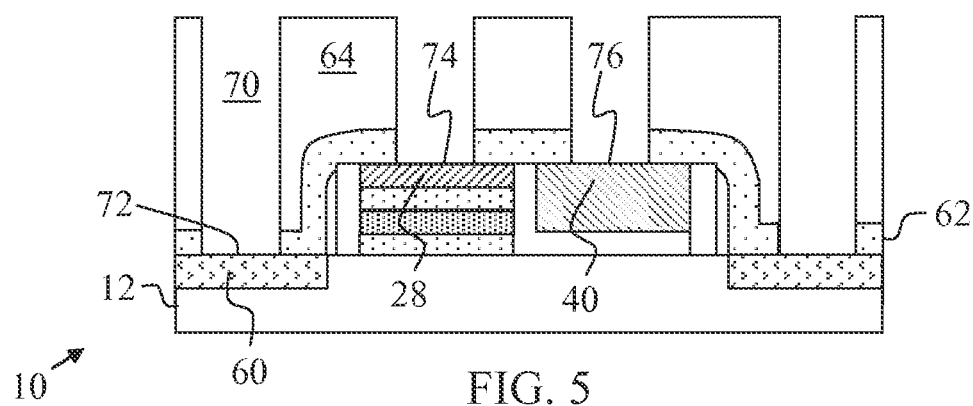

In FIG. 5, the interlayer dielectric 64 and dielectric layer 62 are selectively etched to form vias 70. For example, a mask (not shown) may be deposited over the interlayer dielectric 64 and patterned. Thereafter, an etch process may be used to etch the interlayer dielectric 64 and underlying dielectric layer 62 that is not covered by the patterned mask. An exemplary etch process is anisotropic, such as a reactive ion etch (RIE). The etch lands on the semiconductor substrate 12 or nonvolatile memory device structure 50. Specifically, the exemplary vias 70 expose upper surfaces 72 of the source/drain regions 60, an upper surface 74 of the control gate 28, and the upper surface 76 of the select gate 40. The etch process may be selective to removal of dielectric material in relation to the silicon material of the control gate 28, select gate 40 and source/drain regions 60.

Figure 6:
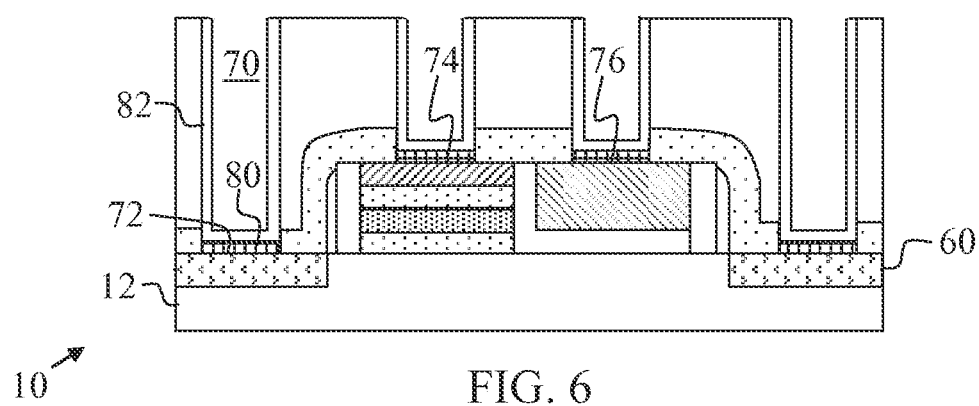

FIG. 6 illustrates further steps of the exemplary embodiment. As shown, nickel-containing material 80 is deposited in each via 70. Specifically, the nickel-containing material 80 is formed on the exposed upper surfaces 72 of the source/drain regions 60, the exposed upper surface 74 of the control gate 28, and the exposed upper surface 76 of the select gate 40. The nickel-containing material 80 may form a single layer or be formed as a composite of more than one layer. An exemplary nickel-containing material 80 is a nickel/titanium bilayer or multi-layer. An exemplary nickel/titanium bilayer or multi-layer may be formed by sputter deposition. In exemplary embodiments, the nickel/titanium bilayer may have a thickness of from about 5 nm to about 15 nm, such as from about 8 nm to about 12 nm. In certain embodiments, the nickel/titanium bilayer may include other metals in addition to nickel and titanium.

In other embodiments, the nickel-containing material 80 may be a nickel/titanium alloy. An exemplary nickel-titanium alloy may be deposited by sputter deposition. In exemplary embodiments, the nickel/titanium alloy may have a thickness of from about 5 nm to about 15 nm, such as from about 8 nm to about 12 nm. In certain embodiments, the nickel/titanium alloy may include other metals in addition to nickel and titanium. Also, the nickel-containing material 80 may be provided as a nickel in titanium contact glue layer. Such a nickel-containing material 80 may be deposited with distinct nickel particles and titanium particles, such as in a powder form.

After forming the nickel-containing material 80 on the upper surfaces 72, 74 and 76, the exemplary process may continue with the deposition of a contact liner 82. In the exemplary process, the contact liner 82 is conformally deposited in the vias 70 and forms over the nickel-containing material 80 and along the sidewalls of the vias 70. The contact liner 82 may be formed of one layer or as a composite of more than one layer. An exemplary contact liner 82 is a titanium nitride coating. In an exemplary embodiment, the contact liner 82 is conformally deposited by sputtering, CVD, or ALD. In another exemplary embodiment, the contact liner 82 includes a titanium layer and a titanium nitride layer. Such a contact liner 82 may be formed by depositing titanium by PVD and depositing titanium nitride over the titanium by CVD or ALD.

Figure 7:
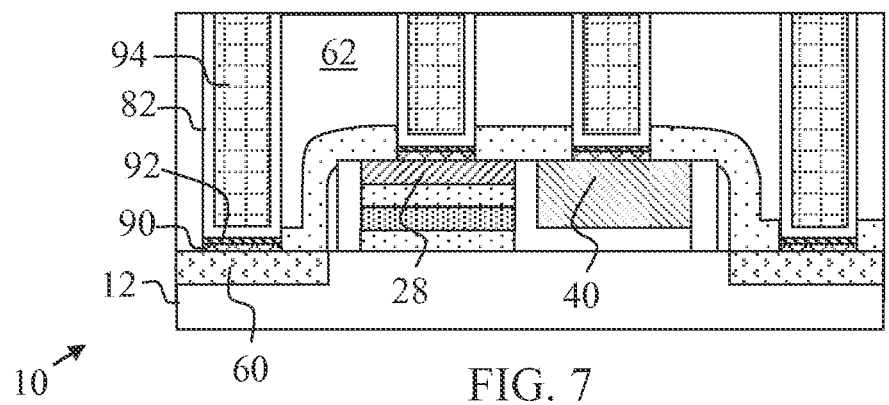

In FIG. 7, the exemplary embodiment may continue with annealing the nonvolatile memory device structure 50. For example, a rapid thermal anneal (RTA) process may be used to anneal the nonvolatile memory device structure 50. In an exemplary embodiment, the anneal process is performed at a temperature of no more than about 550° C., such as no more than about 500° C., for example no more than about 400° C. In an exemplary embodiment, the anneal process is a spike anneal process. In other embodiments, the anneal process is performed for a duration of from 0 seconds to about 120 seconds, such as for about 30 seconds to about 60 seconds. As a result of the anneal process, the nickel in the nickel-containing material 80 reacts with silicon in the source/drain regions 60, control gate 28 and select gate 40 to form silicide contacts 90. While the formation of silicide may consume all of the nickel-containing material 80, in the exemplary embodiment a portion 92 of the nickel-containing material 80 (including non-nickel components) remains. For example, a titanium layer in a bilayer structure may remain. Silicide formation will likewise consume a portion of the silicon in the semiconductor substrate 12.

In the exemplary embodiment, a fill metal 94 is then deposited over the contact liner 82 to fill the trenches. An overburden portion of the fill metal 94 may be removed by CMP. As a result, the integrated circuit 10 is provided with the structure illustrated in FIG. 7. In various embodiments, the method may continue to include process steps such as formation of interconnect structures (e.g., additional lines, vias, metal layers, and interlayer dielectric material). In FIG. 7 the integrated circuit 10 includes a stack-gate nonvolatile memory device. The nonvolatile memory device is formed with nickel silicide contacts to reduce resistivity and improve device performance.

In summary, a fabrication process is implemented to form an integrated circuit with improved nonvolatile memory devices. Contacts to source/drain regions, the control gate and the select gate are formed by nickel silicide. Further, the nickel silicide is formed through use of annealing processes performed at low temperatures. As a result, resistivity at the contacts is minimized.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate;

forming a nonvolatile memory structure over the semiconductor substrate, wherein the nonvolatile memory structure includes a gate terminating at an upper gate surface;

depositing a dielectric material over the nonvolatile memory structure;

etching the dielectric material to form a first via exposing the upper gate surface;

depositing a nickel-containing material in the first via and over the upper gate surface; and annealing the nonvolatile memory structure and forming a nickel silicide contact on the upper gate surface from the nickel-containing material.

2. The method of claim 1 further comprising:

forming a source/drain region in the semiconductor substrate; and depositing the nickel-containing material directly on the source/drain region, wherein annealing the nonvolatile memory structure comprises forming a nickel silicide contact on the source/drain region from the nickel-containing material.

3. The method of claim 1 wherein the nonvolatile memory structure includes a control gate terminating at a control gate surface and a select gate terminating at a select gate surface, wherein depositing the nickel-containing material comprises depositing the nickel-containing material on the control gate surface and on the select gate surface, and wherein annealing the nonvolatile memory structure comprises forming a first nickel silicide contact on the control gate surface from the nickel-containing material and forming a second nickel silicide contact on the select gate surface from the nickel-containing material.

4. The method of claim 1 further comprising:

forming a source/drain region in the semiconductor substrate;

depositing a dielectric material over the nonvolatile memory structure; and etching the dielectric material to form a first via exposing the upper gate surface and a second via exposing the source/drain region, wherein depositing the nickel-containing material over the upper gate surface comprises depositing the nickel-containing material in the first via and on the upper gate surface and in the second via and on the source/drain region.

5. The method of claim 1 wherein depositing the nickel-containing material over the upper gate surface comprises depositing the nickel-containing material on a first portion of the upper gate surface, wherein the nickel-containing material is not deposited on a second portion of the upper gate surface.

6. The method of claim 1 wherein the gate is polysilicon and wherein depositing nickel-containing material over the upper gate surface comprises depositing nickel-containing material on the polysilicon.

7. The method of claim 1 further comprising:

depositing a dielectric material over the nonvolatile memory structure and the semiconductor substrate; and etching the dielectric material to form a via exposing the upper gate surface, wherein depositing a nickel-containing material over the upper gate surface comprises depositing the nickel-containing material in the via.

8. The method of claim 1 further comprising:

forming a source/drain region in the semiconductor substrate;

depositing a dielectric material over the nonvolatile memory structure and the semiconductor substrate;

etching the dielectric material to form vias exposing the upper gate surface and the source/drain region;

depositing the nickel-containing material over the source/drain region, wherein depositing the nickel-containing material over the upper gate surface and over the source/drain region comprises depositing the nickel-containing material in the vias, and wherein annealing the nonvolatile memory structure comprises forming a nickel silicide contact on the source/drain region;

depositing a contact liner in the vias and over the nickel-containing material; and filling the vias with a fill metal to form electrical contact structures to the upper gate surface and the source/drain region.

9. A method for fabricating an integrated circuit, the method comprising:

providing a stack gate memory structure overlying a semiconductor substrate and adjacent source/drain regions formed in the semiconductor substrate, wherein the stack gate memory structure includes a control gate lying over a floating gate in a stack and a select gate formed adjacent the stack;

depositing a nickel-containing material on a surface of the control gate and on a surface of the select gate;

depositing a contact liner over the nickel-containing material;

annealing the stack gate memory structure and forming a silicide contact on the surface of the control gate from the nickel-containing material and a silicide contact on the surface of the select gate from the nickel-containing material.

10. The method of claim 9 wherein annealing the stack gate memory structure and forming a silicide contact on the surface of the control gate and a silicide contact on the surface of the select gate comprises heating the stack gate memory structure at a temperature of no more than about 550° C.

11. The method of claim 9 wherein annealing the stack gate memory structure and forming a silicide contact on the surface of the control gate and a silicide contact on the surface of the select gate comprises heating the stack gate memory structure at a temperature of no more than about 500° C.

12. The method of claim 9 wherein depositing a nickel-containing material on a surface of the control gate and on a surface of the select gate comprises forming a nickel/titanium bilayer on the surface of the control gate and on the surface of the select gate.

13. The method of claim 9 wherein depositing a nickel-containing material on a surface of the control gate and on a surface of the select gate comprises forming a nickel/titanium alloy on the surface of the control gate and on the surface of the select gate.

14. The method of claim 9 further comprising:

depositing a dielectric material over the stack gate memory structure; and etching the dielectric material to form vias exposing the surface of the control gate and the surface of the select gate, wherein depositing a nickel-containing material on a surface of the control gate and on a surface of the select gate comprises depositing the nickel-containing material in the vias, and wherein depositing a contact liner over the nickel-containing material comprises depositing the contact liner in the vias.

15. The method of claim 9 further comprising depositing the nickel-containing material on surfaces of the source/drain regions, wherein annealing the stack gate memory structure comprises forming silicide contacts on the surfaces of the source/drain regions from the nickel-containing material.

16. The method of claim 15 further comprising:
depositing a dielectric material over the stack gate memory structure; and
etching the dielectric material to form vias exposing the surface of the control gate, the surface of the select gate, and the surfaces of the source/drain regions, wherein depositing a nickel-containing material comprises depositing the nickel-containing material in the vias.

17. The method of claim 16 wherein depositing a contact liner over the nickel-containing material comprises depositing a titanium nitride liner in the vias over the nickel-containing material.

18. The method of claim 17 further comprising filling the vias with a fill metal to form electrical contact structures to the source/drain regions, the control gate and the select gate.

19. A method for fabricating an integrated circuit, the method comprising:
providing a stack gate memory structure overlying a semiconductor substrate, wherein the stack gate memory structure includes a control gate lying over a floating gate in a stack and a select gate formed adjacent the stack;
depositing a nickel-containing material on a surface of the control gate and on a surface of the select gate; and
annealing the stack gate memory structure and forming a silicide contact on the surface of the control gate from the nickel-containing material and a silicide contact on the surface of the select gate from the nickel-containing material.

20. The method of claim 19 further comprising depositing a contact liner over the nickel-containing material before annealing the stack gate memory structure.

* * * * *